(12) United States Patent
Kim et al.

(10) Patent No.: US 11,749,356 B2
(45) Date of Patent: Sep. 5, 2023

(54) NON-VOLATILE MEMORY DEVICE, A MEMORY SYSTEM THAT INCLUDES THE NON-VOLATILE MEMORY DEVICE, AND AN OPERATING METHOD OF THE NON-VOLATILE MEMORY DEVICE

(71) Applicant: SAMSUNG ELECTRONICS CO., LTD., Suwon-si (KR)

(72) Inventors: Jinyoung Kim, Seoul (KR); Sehwan Park, Yongin-si (KR); Youngdeok Seo, Seoul (KR); Dongmin Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 17/450,871

(22) Filed: Oct. 14, 2021

(65) Prior Publication Data

US 2022/0254419 A1    Aug. 11, 2022

(30) Foreign Application Priority Data

Feb. 8, 2021    (KR) .......................... 10-2021-0017873

(51) Int. Cl.
| | | |
|---|---|---|
| *G11C 16/30* | (2006.01) | |
| *H01L 25/065* | (2023.01) | |
| *H01L 25/18* | (2023.01) | |
| *H01L 23/00* | (2006.01) | |
| *G11C 5/14* | (2006.01) | |

(52) U.S. Cl.
CPC ............. *G11C 16/30* (2013.01); *H01L 24/08* (2013.01); *H01L 25/0657* (2013.01); *H01L 25/18* (2013.01); *G11C 5/147* (2013.01); *G11C 5/148* (2013.01); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | | |
|---|---|---|---|
| 10,234,930 B2 * | 3/2019 | Lee | ........................... G06F 9/50 |
| 10,437,321 B2 | 10/2019 | Rowley | |
| 10,643,672 B2 | 5/2020 | Parry et al. | |
| 10,672,479 B2 | 6/2020 | Kim et al. | |
| 10,732,871 B2 | 8/2020 | Benisty et al. | |
| 2017/0371394 A1 * | 12/2017 | Chan | ..................... G06F 1/3218 |
| 2019/0278496 A1 | 9/2019 | Rowley | |

(Continued)

*Primary Examiner* — Tan T. Nguyen
(74) *Attorney, Agent, or Firm* — F. Chau & Associates, LLC

(57) ABSTRACT

A memory system includes a non-volatile memory device including a machine learning (ML) module and a peripheral power management integrated circuit (IC), and a memory controller configured to command the non-volatile memory device to enter an idle mode by providing an external power command to the non-volatile memory device. The machine learning (ML) module configures a neural network and trains the neural network via machine learning, and the peripheral power management IC is configured to generate an internal power command that is different from the external power command based on the external power command and monitoring information corresponding to the ML module.

20 Claims, 12 Drawing Sheets

(56) References Cited

U.S. PATENT DOCUMENTS

2020/0183598 A1 6/2020 Hong et al.
2020/0210079 A1 7/2020 Cho et al.
2020/0349484 A1* 11/2020 Serven ............. G06Q 10/06312

* cited by examiner

FIG. 6A

|  | IVC1 | IVC2 | IVC3 |
|---|---|---|---|
|  | PERI Logic | Buffer Memory PERI PMIC | ML Module |
|  | 1.3V | 1.0V | 0.8V |
| Active | ON | ON | ON |
|  | Active IVC1 | Active IVC2 | Active IVC3 |
| Standby | ON | ON | ON |
|  | Standby IVC1 | Standby IVC2 | Standby IVC3 |
| Idle_1 | OFF | ON | ON |
|  | – | Idle IVC2 | Idle IVC3 |
| Idle_2 | OFF | ON | OFF |
|  | – | Idle IVC2 | – |
| Idle_3 | OFF | OFF | OFF |
|  | – | – | – |

|       | IVC1      | IVC2                       | IVC3      |
|       | PERI Logic | Buffer Memory PERI PMIC | ML Module |
|-------|-----------|----------------------------|-----------|
| Case1 | 1.3V      | 1.1V                       | 0.8V      |
| Case2 | 1.1V      | 1.1V                       | 1.0V      |
| Case3 | 1.3V      | 1.0V                       | 1.0V      |
| Case4 | 1.0V      | 1.0V                       | 1.0V      |

FIG. 8

|  | IVC4 | IVC1 | IVC2 | IVC3 |
|---|---|---|---|---|
|  | Page Buffer | PERI Logic | Buffer Memory PERI PMIC | ML Module |
|  | 1.3V | 1.2V | 1.0V | 0.8V |
| Active | ON | ON | ON | ON |
|  | Active IVC1 | Active IVC2 | Active IVC3 | Active IVC4 |
| Standby | ON | ON | ON | ON |
|  | Standby IVC1 | Standby IVC2 | Standby IVC3 | Standby IVC4 |
| Idle_1 | OFF | ON | ON | ON |
|  | - | Idle IVC2 | Idle IVC3 | Idle IVC4 |
| Idle_2 | OFF | OFF | ON | ON |
|  | - | - | Idle IVC3 | Idle IVC4 |
| Idle_3 | OFF | OFF | ON | OFF |
|  | - | - | Idle IVC3 | - |
| Idle_4 | OFF | OFF | OFF | OFF |
|  | - | - | - | - |

NON-VOLATILE MEMORY DEVICE, A MEMORY SYSTEM THAT INCLUDES THE NON-VOLATILE MEMORY DEVICE, AND AN OPERATING METHOD OF THE NON-VOLATILE MEMORY DEVICE

CROSS-REFERENCE TO RELATED APPLICATIONS

This application claims priority under 35 U.S.C. § 119 to Korean Patent Application No. 10-2021-0017873, filed on Feb. 8, 2021, in the Korean Intellectual Property Office, the disclosure of which is incorporated by reference herein in its entirety.

TECHNICAL FIELD

The inventive concept relates to a memory device, and more particularly, to a non-volatile memory device, a memory system that includes the non-volatile memory device, and an operating method of the non-volatile memory device.

DISCUSSION OF RELATED ART

Memory devices implemented in communication devices have increased in capacity and integration with the communication devices. For example, a chip-to-chip (C2C) structure may increase the capacity and integration of memory devices with communication devices. Unlike a cell over peripheral (COP) structure in which a cell and a peripheral circuit are all manufactured in one wafer, in a C2C structure, a cell and a peripheral circuit are separately manufactured in different wafers and are bonded to each other. Because the cell and the peripheral circuit are separately manufactured, customization of the C2C structure is easily accomplished via a precise logic process, such as machine learning.

SUMMARY

The inventive concept provides a non-volatile memory device, that includes an integrated circuit (IC) for managing internal power of the non-volatile memory device, and an operating method of the non-volatile memory device. The non-volatile memory device may reduce input/output power consumption and latency, while minimizing a risk of losing a learning parameter and SRAM data.

According to an embodiment of the inventive concept, a non-volatile memory device includes a memory cell array, a buffer memory configured to receive machine learning (ML) parameter data from the memory cell array and to temporarily store the ML parameter data, a peripheral logic circuit that includes a row decoder, a page buffer, and a scheduler unit, an ML module that includes an inference module configured to output an optimal value corresponding to an input received from the peripheral logic circuit by performing an inference operation, a multiply-accumulate (MAC) circuit configured to perform a plurality of arithmetic operations for the inference module, and an ML logic circuit configured to generate a monitoring signal indicating a state of each of the MAC circuit and the buffer memory, and a peripheral power management integrated circuit (IC) configured to receive an external power command corresponding to an idle mode from a memory controller and to generate an internal power command that is different from the external power command based on the received external power command and the monitoring signal. The scheduler unit schedules a write operation and a read operation and the ML module configures a neural network based on the ML parameter data.

According an embodiment of the inventive concept, a memory system includes a non-volatile memory device including a machine learning (ML) module and a peripheral power management integrated circuit (IC), and a memory controller configured to command the non-volatile memory device to enter an idle mode by providing an external power command to the non-volatile memory device. The machine learning (ML) module configures a neural network and trains the neural network via machine learning, and the peripheral power management IC is configured to generate an internal power command that is different from the external power command based on the external power command and monitoring information corresponding to the ML module.

According to an embodiment of the inventive concept, an operating method of a peripheral power management integrated circuit (IC) controlling an internal voltage of a non-volatile memory device includes receiving an external power command corresponding to an idle mode from a memory controller, turning off a peripheral logic circuit of the non-volatile memory device in response to receiving the external power command, receiving a monitoring signal from a machine learning (ML) module of the non-volatile memory device, and generating an internal power command indicating an on state or an off state of the ML module and a buffer memory based on the monitoring signal. The monitoring signal comprises at least one of a multiply-accumulate (MAC) flag signal corresponding to a state of an MAC circuit performing an arithmetic operation for the ML module and a buffer flag signal corresponding to a state of the buffer memory loading ML parameter data corresponding to a neural network of the ML module.

BRIEF DESCRIPTION OF THE DRAWINGS

The above and other features of the inventive concept will become more apparent by describing in detail embodiments thereof with reference to the accompanying drawings, in which:

FIG. 6A is a table of internal voltage driver states according to an embodiment of the inventive concept;

FIG. 6B illustrates a mapping table according to an embodiment of the inventive concept;

FIG. 8 is a table of internal voltage driver states according to an embodiment of the inventive concept;

DETAILED DESCRIPTION OF THE EMBODIMENTS

Figure 1:
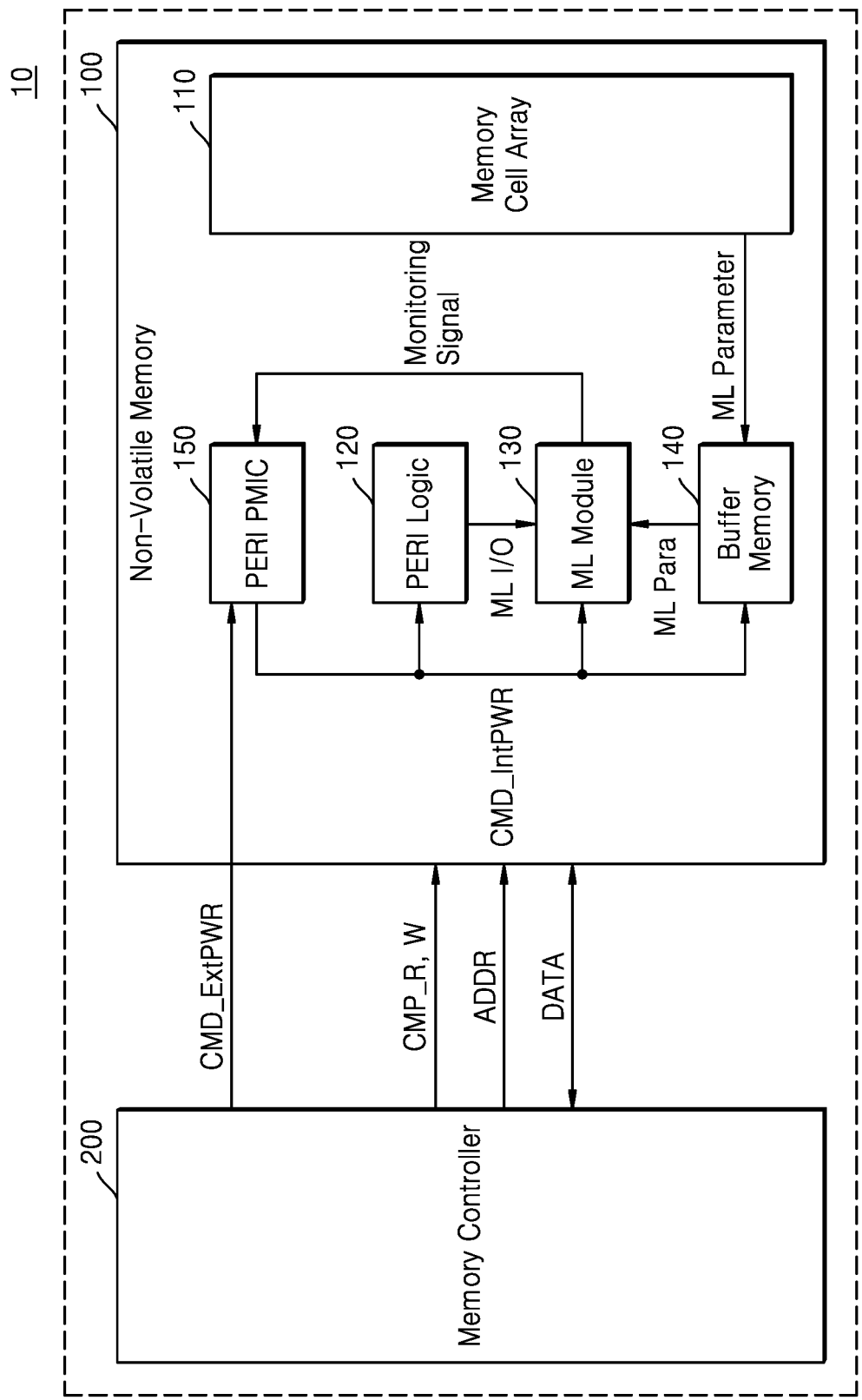
FIG. 1 is a block diagram of a memory system according to an embodiment of the inventive concept.

Embodiments of the inventive concept will be described more fully hereinafter with reference to the accompanying drawings. Like numerals may refer to like elements throughout.

As is traditional in the field of the inventive concept, embodiments are described and illustrated in the drawings in terms of functional blocks, units, and/or modules. Those skilled in the art will appreciate that these blocks, units, and/or modules may be physically implemented by electronic (or optical) circuits such as logic circuits, discrete components, microprocessors, hard-wired circuits, memory elements, wiring connections, etc.

As used herein, the term "and/or" includes any and all combinations of one or more of the associated listed items.

It will be understood that, although the terms "first", "second", etc. may be used herein to describe various elements, these elements should not be limited by these terms. These terms are only used to distinguish one element from another element. Thus, a first element discussed below could be termed a second element without departing from the teachings of the inventive concept. As used herein, the singular forms, "a", "an" and "the" are intended to include the plural forms as well, unless the context clearly indicates otherwise.

FIG. 1 is a block diagram of a memory system 10 according to an embodiment of the inventive concept.

Referring to FIG. 1, the memory system 10 may include a non-volatile memory device 100 and a memory controller 200. In an embodiment, the memory system 10 may be implemented as an internal memory embedded in an electronic device, and for example may include an embedded universal flash storage (UFS), an embedded multimedia card (eMMC), or a solid state drive (SSD).

In an embodiment, the memory system 10 may be implemented as an external memory that is detachably attached to an electronic device. For example, the memory system 10 may include a UFS memory card, a compact flash (CF) card, a secure digital (SD) card, a mini secure digital (Mini-SD) card, an extreme digital (xD) card, or a memory stick.

The memory system 10 may be applied to robot devices such as drones and advanced drivers assistance systems (ADASs), smart televisions (TVs), smartphones, medical devices, mobile devices, image display devices, measurement devices, and Internet of Things (IoT) devices, and moreover may be equipped in one of various kinds of electronic devices.

In response to a read/write request from a host, the memory controller 200 may control the non-volatile memory device 100 to read data stored in the non-volatile memory device 100 or to write data to the non-volatile memory device 100. The memory controller 200 may control a write operation, a read operation, an erase operation, and a plurality of arithmetic operations of the non-volatile memory device 100 by providing a command, an address, and/or a control signal to the non-volatile memory device 100. Data may be transmitted and received between the memory controller 200 and the non-volatile memory device 100. According to an embodiment, the memory controller 200 may provide write data, an address ADDR, and a write command CMD_W, which are to be written in the non-volatile memory device 100, to the non-volatile memory device 100. The memory controller 200 may provide the address ADDR and a write command CMD_R to the non-volatile memory device 100, and the non-volatile memory device 100 may transmit read data to the memory controller 200 in response to receiving the address ADDR and the write command CMD_R.

The memory controller 200 may provide an external power command CMD_ExtPWR to the non-volatile memory device 100 and the non-volatile memory device 100 may enter an idle mode in response to receiving the external power command CMD_ExtPWR. In the idle mode, the non-volatile memory device 100 may reduce a power level of the non-volatile memory device 100. Alternatively, the non-volatile memory device 100 might not enter the idle mode in response to receiving the external power command CMD_ExtPWR from the memory controller 200, and may instead generate an internal power command CMD_IntPWR based on the external power command CMD_ExtPWR and state information corresponding to the non-volatile memory device 100. The internal power command CMD_IntPWR will be described in further detail below.

The non-volatile memory device 100 may be implemented as a non-volatile memory chip. The non-volatile memory device 100 may include a memory cell array 110, a peripheral logic circuit 120, a machine learning (ML) module 130, a buffer memory 140, and a peripheral power management integrated circuit (IC) 150. Hereinafter, the memory cell array 110, the peripheral logic circuit 120, the machine learning (ML) module 130, the buffer memory 140, and the peripheral power management integrated circuit (IC) 150 may be collectively referred to as "the first components".

In an embodiment, the non-volatile memory device 100 may be a NAND flash memory device. However, the embodiments of the inventive concept are not necessarily limited thereto, and the non-volatile memory device 100 may be implemented as various non-volatile memory devices, such as electrically erasable and programmable read only memory (ROM) (EEPROM) devices, NOR flash memory devices, phase random access memory (RAM) (PRAM) devices, resistive RAM (RRAM) devices, ferroelectric RAM (FeRAM) devices, magnetic RAM (MRAM) devices, spin-transfer torque MRAM devices, conductive bridging RAM (CBRAM) devices, nano tube RAM devices, polymer RAM (PoRAM) devices, nano floating gate memory (NFGM) devices, holographic memory devices, molecular electronics memory devices, insulator resistance change memory devices, or the like.

The non-volatile memory device 100 may include a peripheral region and a storage region. The storage region may be referred to as a cell region. The memory cell array 110 may be implemented as the storage region, and the peripheral logic circuit 120, the ML module 130, the buffer memory 140, and the peripheral power management IC 150 (i.e., the first components) may be included in the peripheral region.

The peripheral logic circuit 120 may include a scheduler, a charge pump, and a row decoder XDD which may control an overall operation of reading data from the memory cell array 110 or writing data to the memory cell array 110. The ML module 130 may perform machine learning by learning an optimal read voltage corresponding to the read command CMD_R or an optimal program voltage corresponding to the write command CMD_W, or by learning a defensive code that minimizes the failure rate of an error correction code (ECC) corresponding to read data. For example, the ML module 130 may read ML parameter data from the non-volatile memory device 100, may generate a neural network that receives, as an input, target address information ADDR received from the peripheral logic circuit 120, and may train the neural network. For example, the ML module 130 may perform an arithmetic operation of the plurality of arithmetic operations based on input data received by the ML module 130 and may learn an optimal read voltage based on the arithmetic operation.

The neural network may be implemented according to various neural network models, such as GoogleNet, AlexNet, convolution neural networks (CNN) such as a VGG network, a region with convolution neural network (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, or a classification network, or may alternatively or additionally be implemented according to other neural network models.

In an embodiment, the ML module 130 may be based on the neural network model described above, but the ML module 130 may alternatively or additionally be based on linear regression and/or a decision tree, or may be based on a combination of two or more of the neural network model, the linear regression, and the decision tree.

The buffer memory 140 may temporarily store data received from the memory cell array 110. The buffer memory 140 may be implemented as a volatile memory such as SRAM. For example, the buffer memory 140 may receive and store the ML parameter data from the memory cell array 110. The ML parameter data may include weight values that indicate a relationship between a plurality of nodes included in the neural network. For example, the ML parameter data may include travel direction values that correspond to an optimal travel path from a previous node to a next node of the plurality of nodes in the neural network. The ML module 130 may determine weight values corresponding to an optimal input voltage (e.g., an optimal power level), an optimal program voltage, an optimal erase voltage, and an optimal defensive code of each node of the plurality of nodes by training the neural network.

The peripheral power management IC 150 may control power provided to the peripheral logic circuit 120, the ML module 130, and the buffer memory 140. The peripheral power management IC 150 may generate the internal power command CMD_IntPWR based on the external power command CMD_ExtPWR and a monitoring signal received from the ML module 130. The monitoring signal may indicate the state information. The internal power command CMD_IntPWR may differ from the external power command CMD_ExtPWR. In an embodiment, the non-volatile memory device 100 may enter the idle mode in response to the peripheral power management IC 150 receiving the external power command CMD_ExtPWR, or, based on the external power command CMD_ExtPWR and the state information indicating that the ML parameter data is temporarily stored in the buffer memory 140 and/or that the ML module 130 is performing a neural network inference operation and/or training the neural network, the peripheral power management IC 150 may generate the internal power command CMD_IntPWR, and the non-volatile memory device 100 may maintain the power level at a present value. By maintaining the power level, the non-volatile memory device 100 may avoid erasing the ML parameter data and may efficiently operate the ML module 130 by preventing sudden power-off (SPO). The peripheral power management IC 150 will be described in further detail below.

The memory cell array 110 may include a plurality of memory blocks and a plurality of pages, and each memory block of the plurality of memory blocks may include a group of pages of the plurality of pages. An erase operation may be independently performed on each memory block of the plurality of memory blocks, and a read operation may be independently performed on each page of the plurality of pages. The memory cell array 110 may include a plurality of memory cells. In an embodiment, the plurality of memory cells may include a plurality of flash memory cells. Hereinafter, embodiments will be described in which the plurality of memory cells include a plurality of NAND flash memory cells. However, embodiments of the inventive concept are not necessarily limited thereto, and the plurality of memory cells may alternatively or additionally include a plurality of resistive memory cells such as RRAM memory cells, PRAM memory cells, or MRAM memory cells.

Figure 2:
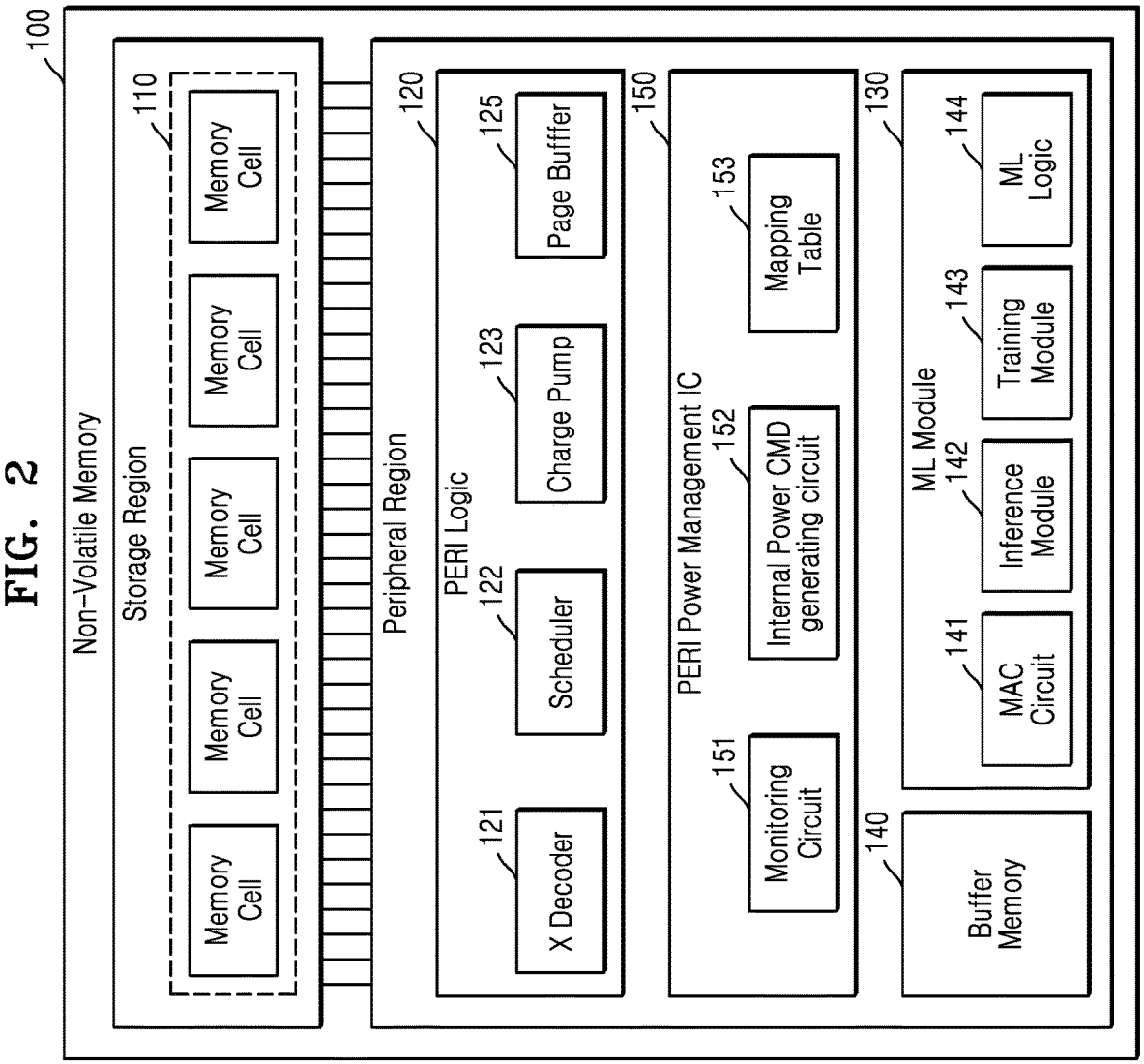
FIG. 2 is a block diagram of the non-volatile memory device of FIG. 1 according to an embodiment of the inventive concept.

FIG. 2 is a block diagram of the non-volatile memory device 100 according to an embodiment of the inventive concept.

Referring to FIG. 2, the non-volatile memory device 100 may be arranged in a chip-to-chip (C2C) structure. The C2C structure may indicate that an upper chip that includes a storage region is manufactured in a first wafer, a lower chip that includes the peripheral region is manufactured in a second wafer that is different from the first wafer, and the upper chip is connected to the lower chip by a bonding process.

For example, the bonding process may include electrically connecting a bonding metal formed in an uppermost metal layer of the upper chip to a bonding metal formed in an uppermost metal layer of the lower chip.

By arranging the non-volatile memory device 100 in the C2C structure as described above, the first wafer corresponding the storage region and the second wafer corresponding to the peripheral region may be independently manufactured from each other. The first and second wafers independently manufactured from each other may be bonded to each other, and thus, may connect to each other. As a result of this independent manufacturing, the peripheral region may be manufactured according to a precise logic process. In a comparative example, a peripheral logic may control data input/output of a non-volatile memory device, and moreover, may perform a number of arithmetic operations as part of a neural network learning process. In contrast to the comparative example, however, in an embodiment, the non-volatile memory device 100 may include an ML module 130 and a buffer memory 140 in the peripheral region. The ML module 130 may perform various arithmetic operations as part of the neural network learning operation, and thus, the non-volatile memory device 100 may control the memory system 10 by performing the plurality of arithmetic operations and omitting a signal exchange operation performed with the peripheral logic circuit 120, thereby increasing performance of the memory system 10 by, for example, reducing latency.

The peripheral logic circuit 120 may include a row decoder 121, a scheduler unit 122, a charge pump 123, and a page buffer 125. In an embodiment, the row decoder 121 may select at least one word line, and therefore at least one page including a group of memory cells connected to the selected word line, from among a plurality of word lines WL in response to receiving a row address X-ADDR provided from the peripheral logic circuit 120. In an embodiment, the non-volatile memory device 100 may store data corresponding to a weight value configuring the neural network in a meta region corresponding to the plurality of pages. During the neural network inference operation performed via the ML module 130, the row decoder 121 may select one or more pages of the plurality of pages corresponding to the meta region and may read ML parameter data written in the selected one or more pages.

The scheduler unit 122 may schedule a plurality of write operations and read operations of the memory cell array 110 that are simultaneously requested received from the host. For example, when a number of requested operations are greater than a threshold operation number, the scheduler unit 122 may decrease the number of requested operations and may change an order of the requested operations, and the non-volatile memory device 100 may accordingly delay garbage collection and preferentially perform a read operation after a plurality of write operations.

The page buffer 125 may select a group of bit lines from among a plurality of bit lines BL in response to receiving a column address Y-ADDR provided from the peripheral logic circuit 120. For example, the page buffer 125 may operate as a write driver or a sense amplifier based on an operation mode of the non-volatile memory device 100 (e.g., a write mode or a read mode). In an embodiment, the page buffer 125 may operate as a sense amplifier that reads the ML parameter data from the memory cell array 110.

The ML module 130 may include a multiply-accumulate (MAC) circuit 141, an inference module 142, a training module 143, and an ML logic circuit 144.

The MAC circuit 141 may perform the plurality of arithmetic operations in the neural network inference operations and/or the training of the neural network. For example, the MAC circuit 141 may perform an arithmetic operation of the plurality of arithmetic operations that includes a plurality of operands. For example, in an embodiment, the MAC circuit 141 may perform a convolution operation of the plurality of arithmetic operations or a portion of the convolution arithmetic operation. The MAC circuit 141 may include an MAC circuit that performs a multiply operation and an add operation of the plurality of arithmetic operations. In an embodiment, the MAC circuit 141 may include a plurality of MAC circuits, where each MAC circuit of the plurality of MAC circuits is connected to one another in a ring shape, and may include a non-linear function processor and a quantizer unit.

The inference module 142 may perform the neural network inference operation by generating an inference result corresponding to an input based on the weight values of the neural network. For example, the inference module 142 may receive weight values including at least one of read address information, write address information, and defensive code information as an input and may generate the inference result corresponding to the input.

The training module 143 may train the neural network by updating a weight value generated between nodes of the plurality of nodes. For example, the training module 143 may receive a verification voltage from the buffer memory 140 and may, in response, generate cell count information corresponding to the number of on-cells the number of off-cells, and cell speed information that indicates a time taken until an operation is completed. When the non-volatile memory device 100 performs a plurality of program operations and a plurality of erase operations, a threshold voltage distribution may vary, and thus, the cell count information and the cell speed information generated at a first time T1 may differ from the cell count information and the cell speed information generated at a second time T2, after the neural network has been trained. Therefore, the training module 143 may continually train the neural network based on updated count information and cell speed information, and the ML parameter data corresponding to a later time may differ from the ML parameter data corresponding to an earlier time.

In an embodiment, the ML module 130 may include only the MAC circuit 141 and the inference module 142, and the inference module 142 may output at least one of an optimal program voltage, an optimal erase voltage, an optimal read voltage, and an optimal defensive code based on pre-stored ML parameter data. The ML module 130 may configure the neural network based on the pre-stored ML parameter data and may therefore allow a neural network input to be transmitted among the nodes of the plurality of nodes, thereby obtaining an optimal output. The MAC circuit 141 may perform arithmetic operations of the plurality of arithmetic operations to allow a signal to travel among the plurality of nodes based on an input to the neural network. In a comparative example, when a training module is not included in the ML module, the ML module 130 may only perform a neural network inference operation on a neural network that has been completely trained, and thus, the comparative example may not reflect a threshold voltage distribution that varies based on repeated write and read operations. That is, in the comparative example, the ML module may not train a neural network that corresponds to updated cell speed information and count information corresponding to cells in an on state and cells in an off state that change states based on a series of program and erase operations.

The ML logic circuit 144 may control the ML module 130 by generating and providing the monitoring signal that indicates a state of the ML module 130 and activating the training module 143 based on a comparison result.

The ML logic circuit 144 may provide the monitoring signal to the peripheral power management IC 150, and the peripheral power management IC 150 may determine an internal power command and may determine the state information corresponding to at least one of the buffer memory 140 and the ML module 130 based on the monitoring signal. For example, the monitoring signal may include a buffer flag signal that indicates a state of the buffer memory 140 and an ML flag signal that indicates an active state of the ML module 130.

The ML logic circuit 144 may activate the training module 143 based on the comparison result. The logic circuit 144 may obtain the comparison result by comparing the cell count information with a threshold cell count. When the number of off-cells, as indicated by the cell count information, is greater than the threshold cell count, this may indicate that a threshold voltage distribution may be different than a target threshold voltage distribution and that training the neural network to determine the optimal program voltage and the optimal erase voltage may therefore be desired.

The peripheral power management IC 150 may include a monitoring circuit 151, an internal power command generating circuit 152, and a mapping table 153. In an embodiment, the monitoring circuit 151 may monitor at least one of the ML module 130 and the buffer memory 140. For example, the monitoring circuit 151 may receive the monitoring signal from the ML logic circuit 144 of the ML module 130, and the monitoring signal may include an ML flag signal. In response to receiving the ML flag signal, the monitoring circuit 151 may output a monitoring result identifying that the ML module 130 is performing a neural network inference operation or a neural network training operation.

The internal power command generating circuit 152 may generate an internal power command CMD_IntPWR based on at least one of an external power command CMD_ExtPWR and the monitoring result of the monitoring circuit 151. In an embodiment, the external power command CMD_ExtPWR may indicate an idle mode, but the internal power command generating circuit 152 may instead control the non-volatile memory device 100 so that the power level of the non-volatile memory device 100 is maintained at the present value.

The mapping table 153 may include table information. The table information may indicate an operation mode status of each of the first components and may indicate a voltage level for of each operation of each of the first components. The internal power command generating circuit 152 may receive the monitoring result from the monitoring circuit 151 and may determine the internal power command CMD_IntPWR corresponding to each of the first components based on the mapping table. The mapping table will be described below in detail.

Figure 3:
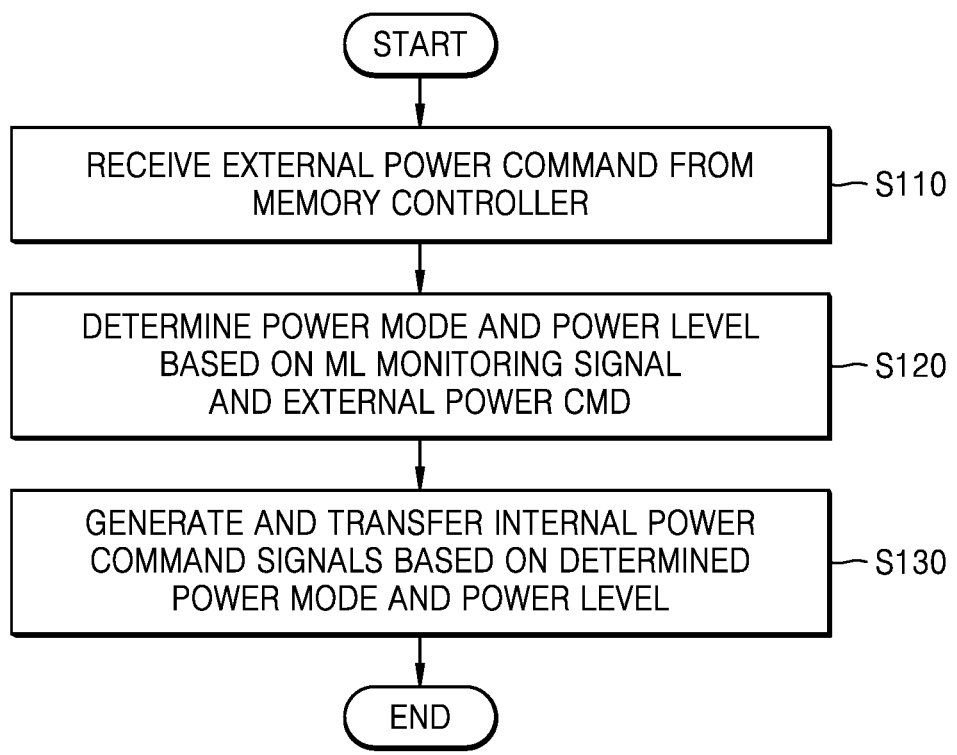
FIG. 3 is a flowchart of an operating method of the non-volatile memory device of FIG. 1 according to an embodiment of the inventive concept.

FIG. 3 is a flowchart illustrating an operating method of the non-volatile memory device 100 according to an embodiment of the inventive concept.

Referring to FIG. 3, in operation S110, the non-volatile memory device 100 may receive an external power command (CMD_ExtPWR of FIG. 1) from the memory controller 200. The external power command CMD_ExtPWR may correspond to one of an active mode, a standby mode, and the idle mode, and the external power command CMD_ExtPWR may thereby command the non-volatile memory device 100 to enter one of the active mode, the standby mode, and the idle mode.

When the external power command CMD_ExtPWR corresponds to the active mode or the standby mode, each of the first components may receive power. On the other hand, when the external power command CMD_ExtPWR corresponds to the idle mode, at least one of the first components may not receive power (e.g., the memory controller 200 may cut off the power to the at least one of the first components). In an embodiment, even when the external power command CMD_ExtPWR corresponds to the idle mode, the non-volatile memory device 100 may maintain the power level at the present value, as each of the first components may include an internal voltage driver.

When the power is cut off, the ML parameter data temporarily stored in the buffer memory 140 may be erased. Additionally, if power is cut off during the neural network inference operation or the training of the neural network, the internal power command generating circuit 152 may not enter the idle mode, despite receiving the external power command CMD_ExtPWR corresponding to the idle mode.

In operation S120, the non-volatile memory device 100 may determine a power mode and a power level based on the monitoring signal and the external power command CMD_ExtPWR. Even when the external power command CMD_ExtPWR corresponds to the idle mode indicating that the power level of the non-volatile memory device 100 is reduced or the power level of the non-volatile memory device 100 is off, the internal power command generating circuit 152 of the non-volatile memory device 100 may generate the internal power command CMD_IntPWR based on the external power command CMD_ExtPWR and the monitoring signal. The internal power command CMD_IntPWR may be provided to each of the first components.

The internal power command CMD_IntPWR may include information corresponding to the power level of each of the first components. For example, the ML module 130 may be performing an operation, but ML parameter data may be in the buffer memory 140, and it may be desirable to maintain the power level of the buffer memory 140 so as to prevent the ML parameter data from being erased. Therefore, the internal power command generating circuit 152 may determine a power mode corresponding to an on state of the buffer memory 140 and an off state of each of the peripheral logic circuit 120 and the ML module 130 and the power level may indicate a voltage level of the buffer memory 140 having the on state.

In operation S130, the non-volatile memory device 100 may generate and provide the internal power command CMD_IntPWR based on the determined power mode and the power level. The internal power command generating circuit 152 may generate the internal power command CMD_IntPWR indicating the power level of each of the first components (i.e., indicating an on/off state of each of the first components) and may provide the internal power command CMD_IntPWR to each of the first components. For example, the internal power command generating circuit 152 may provide the internal power command CMD_IntPWR to each of the peripheral logic circuit 120, the peripheral power management IC 150, the buffer memory 140, and the ML module 130. Each of the peripheral logic circuit 120, the peripheral power management IC 150, the buffer memory 140, and the ML module 130 may include an internal voltage driver and may form an electrical connection to an external voltage Vext based on whether the respective component is in an on state or in an off state (i.e., an active state or an inactive state, respectively). The internal voltage driver of a component in an on may supply a voltage to the component by performing a voltage conversion based on the voltage level of the component.

Figure 4:
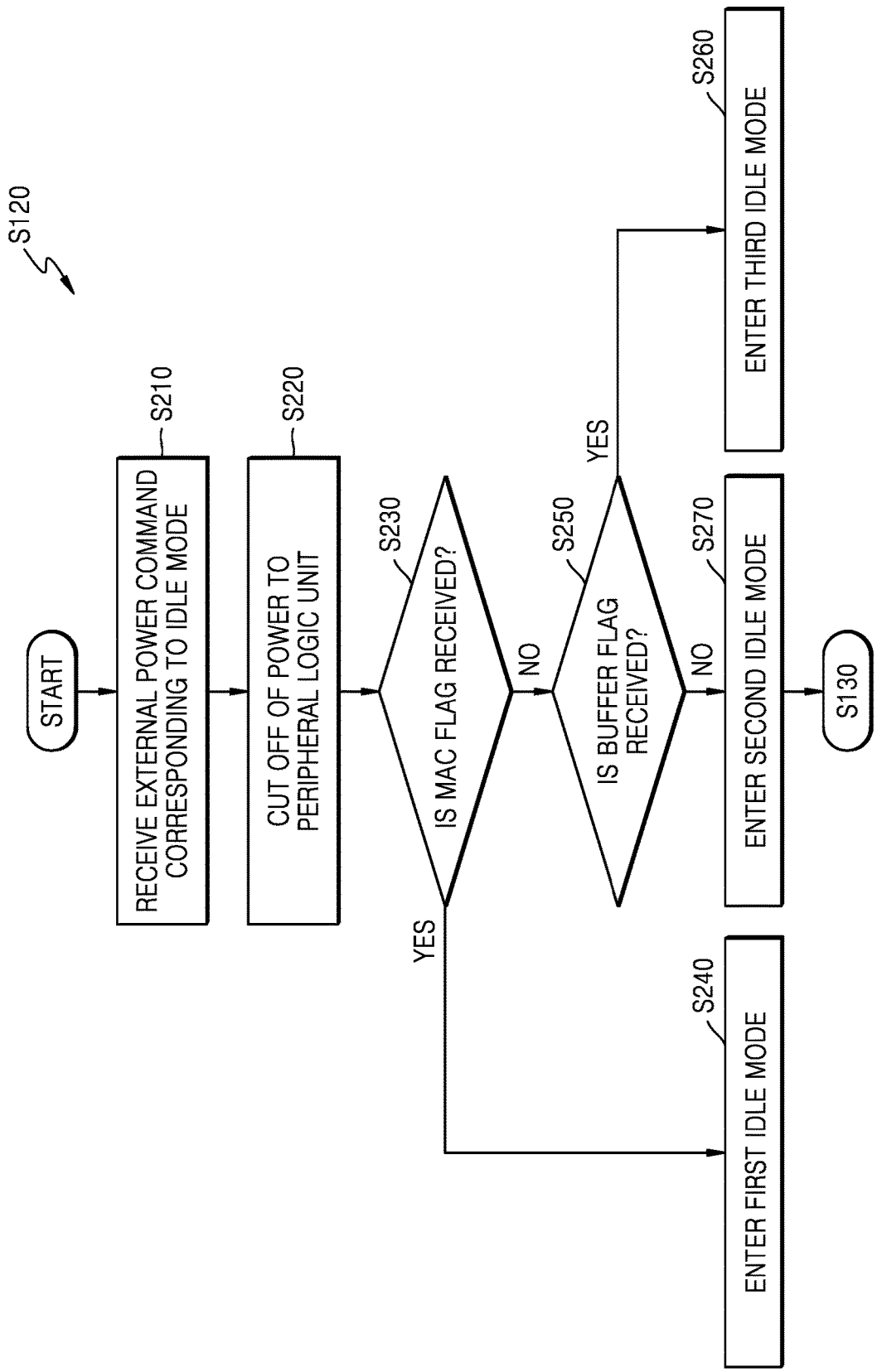
FIG. 4 is a flowchart of an operating method of the non-volatile memory device of FIG. 1 according to an embodiment of the inventive concept.

FIG. 4 is a flowchart of an operating method of the non-volatile memory device 100 according to an embodiment of the inventive concept.

Referring to FIG. 4, in operation S210, the internal power command generating circuit 152 may receive the external power command CMD_ExtPWR corresponding to the idle mode. The internal power command generating circuit 152 may identify the power mode corresponding to the external power command CMD_ExtPWR by receiving and decoding the external power command CMD_ExtPWR from the memory controller 200.

The internal power command generating circuit 152 may determine whether to cut off power to at least one of the first components based on the external power command CMD_ExtPWR corresponding to the idle mode and state information corresponding to the first components.

In operation S220, the internal power command generating circuit 152 may cut off power to the peripheral logic circuit 120. For example, the internal power command generating circuit 152 may provide a control signal to the peripheral logic circuit 120, and in response, the peripheral logic circuit 120 may set a switch of the peripheral logic circuit 120 that is connected to an external power source EXT VPP to an off state, as the read operation and the write operation are not performed when the external power command CMD_ExtPWR corresponding to the idle mode is received from the memory controller 200. That is, in response to receiving the external power command CMD_ExtPWR corresponding to the idle mode, the peripheral logic circuit 120 may enter a continuous off state.

In operation S230, the internal power command generating circuit 152 may determine whether an MAC flag signal is received. When the ML module 130 is in an active state, (for example, when the ML module 130 performs the neural network inference operation or trains the neural network), the ML logic circuit 144 of the ML module 130 may provide the MAC flag signal to the internal power command generating circuit 152. The MAC flag signal may indicate that the MAC circuit 141 is in the active state (e.g., is performing an arithmetic operation of the plurality of arithmetic operations). The internal power command generating circuit 152 may receive the MAC flag signal and thereby determine that the ML module 130 is in the active state.

In operation S240, the internal power command generating circuit 152 may receive the MAC flag signal, and thus, may identify that the ML parameter data is temporarily stored in the buffer memory 140 and that the ML module 130 is in the active state, as the ML parameter data is previously loaded into the buffer memory 140 when the ML module 130 performs the neural network inference operation or trains the neural network. and the non-volatile memory device 100 may enter the first idle mode in response to the internal power command generating circuit 152 receiving the MAC flag signal. In the first idle mode, the internal power command generating circuit 152 may reduce the power level of the peripheral logic circuit 120 so that the peripheral logic circuit 120 is in an off state, and may maintains the power levels of the ML module 130 and the buffer memory 140 so that the ML module 130 and the buffer memory 140 are in an on state.

In operation S250, when the internal power command generating circuit 152 does not receive the MAC flag signal, the internal power command generating circuit 152 may determine whether a buffer flag signal is received. The ML logic circuit 144 may generate the buffer flag signal when the ML module 130 enters an active state, as the ML parameter data corresponding to the neural network is loaded when the ML module 130 enters the active state. That is, when the ML module 130 is in the active state, the ML logic circuit 144 may output the MAC flag signal. Every time the ML logic circuit 144 outputs the MAC flag signal, it may record the output in a history that indicates when the ML module 130 has been in the active state. Based on the history, the buffer memory 140 may store the ML parameter data and the inference result obtained from the inference module 142. Therefore, the ML logic circuit 144 may output the buffer flag signal based on the history.

In operation S260, the internal power command generating circuit 152 may receive the buffer flag signal may determine that the ML module 130 is in the inactive state and that the buffer memory 140 stores the ML parameter data, and the non-volatile memory device 100 may therefore enter a second idle mode. In the second idle mode, the peripheral logic circuit 120 is in the inactive state, the ML module 130 is in the inactive state, and the buffer memory 140 is in the active state so that ML parameter data may be retained.

In operation S270, the internal power command generating circuit 152 does not receive both of the MAC flag signal and the buffer flag signal, and the non-volatile memory device 100 may enter the third idle mode. In the third idle mode, the peripheral logic circuit 120, the ML module 130, and the buffer memory 140 are each in the off state (i.e., the inactive state). The ML module 130 may not enter the active state at least once or more, and thus, the internal power command generating circuit 152 may identify a state where the ML parameter data is not stored in the buffer memory 140.

Although FIGS. 3 and 4 illustrate an embodiment in which the internal power command generating circuit 152 generates the internal power command CMD_IntPWR, embodiments of the inventive concept are not necessarily limited thereto. For example, in an embodiment, the peripheral power management IC 150 may omit the internal power command generating circuit 152. That is, the peripheral power management IC 150 may include only the monitoring circuit 151. Therefore, when the peripheral power management IC 150 receives the external power command CMD_ExtPWR corresponding to the idle mode from the memory controller 200, the peripheral power management IC 150 may set only the peripheral logic circuit 120 to the off state and may provide the MAC flag signal and the buffer flag signal to the memory controller 200. For example, when the memory controller 200 transfers provides the external power command CMD_ExtPWR corresponding to the idle mode and then receives at least one of the MAC flag signal and the buffer flag signal, the memory controller 200 may determine a state of each of the ML module 130 and the buffer memory 140 of the non-volatile memory device 100 based on the received flag signal, may update the external power command CMD_ExtPWR based on the determined state of the ML module 130 and the buffer memory 140, and may provide the updated external power command CMD_ExtPWR. For example, the memory controller 200 may provide the external power command CMD_ExtPWR indicating the idle mode and may receive the MAC flag signal from the peripheral power management IC 150. When the MAC flag signal is received, the memory controller 200 may determine whether the ML module 130 is performing an arithmetic operation and the ML parameter data is stored in the buffer memory 140. In response to the MAC flag signal, the memory controller 200 may provide an updated external power command CMD_ExtPWR corresponding to the first idle mode to the peripheral power management IC 150. The peripheral power management IC 150 may provide the updated external power command CMD_ExtPWR to first to third internal voltage drivers 510 to 530 of the first components (see FIG. 5 and description of FIG. 5 below), and may thus maintain the power levels of the ML module 130 and the buffer memory 140.

Although FIG. 4 illustrates a method in which the external power command CMD_ExtPWR corresponds to the idle mode, embodiments of the inventive concept are not necessarily limited thereto. For example, the external power command CMD_ExtPWR may alternatively correspond to the active mode or the standby mode, and the internal power command generating circuit 152 may generate and provide the internal power command CMD_IntPWR corresponding to the power level corresponding to an identified mode for each of the first components. That is, the first components may not be turned off in the standby mode and the active mode, and the internal power command generating circuit 152 may indicate a power level for each of the first components corresponding to the standby mode or the active mode. As another example, when the internal power command generating circuit 152 receives the external power command CMD_ExtPWR indicating the active mode or the standby mode, the internal power command generating circuit 152 may omit an operation of generating the internal power command CMD_IntPWR and may only provide the received external power command CMD_ExtPWR to each of the first components so as to decrease undesired internal signaling.

Figure 5:
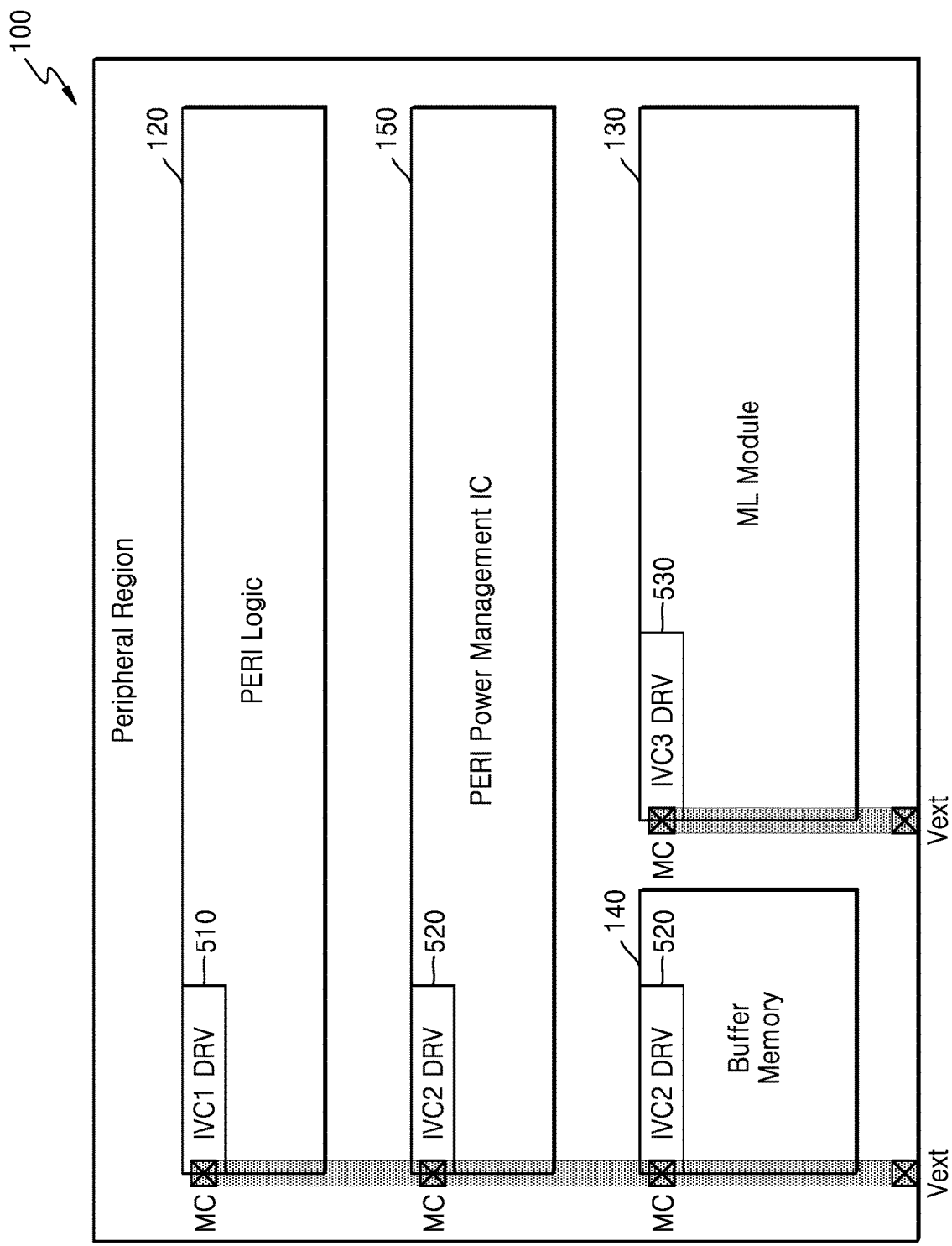
FIG. 5 is a wiring diagram of the non-volatile memory device of FIG. 1 according to an embodiment of the inventive concept.

FIG. 5 is a wiring diagram of the non-volatile memory device 100 according to an embodiment of the inventive concept.

Referring to FIG. 5, each of the first components disposed in the peripheral region of the non-volatile memory device 100, may connect to an external voltage Vext. Each of the first components may include wiring connected to the external voltage Vext, and the wiring may form an internal voltage (IVC) driver DRV and a metal contact MC in each of the first components.

Referring to FIG. 5, the peripheral logic circuit 120 may include a first internal voltage driver 510, the peripheral power management IC 150 and the buffer memory 140 may each include a second internal voltage driver 520, and an ML module 130 may include a third internal voltage driver 530. The first internal voltage driver 510 may convert the external voltage Vext into a first input voltage and may provide the first input voltage to the peripheral logic circuit 120. The second internal voltage driver 520 may convert the external voltage Vext into a second input voltage and may provide the second input voltage to the peripheral power management IC 150 and the buffer memory 140. The third internal voltage driver 530 may convert the external voltage Vext into a third input voltage and may provide the third input voltage to the ML module 130. Each input voltage may correspond to a power level of an internal voltage driver.

As the peripheral power management IC 150 and the buffer memory 140 both include a second internal voltage driver 520, the ML parameter data stored in the buffer memory 140 may be prevented from being erased and the power levels of the first components may be managed with a minimum of consumption power.

The first to third internal voltage drivers 510 to 530 may operate independently from each other. For example, each of the first to third internal voltage drivers 510 to 530 may connect and disconnect via switches to the metal contact MC based on the power mode indicated by the internal power command CMD_IntPWR. For example, when the internal power command generating circuit 152 receives only a buffer flag signal, because it is sufficient to maintain only ML parameter data stored in the buffer memory 140, the internal power command generating circuit 152 may provide, to each of the first to third internal voltage drivers 510 to 530, the internal power command CMD_IntPWR corresponding to the second idle mode (i.e., the first components other than the buffer memory 140 are in an inactive state). For example, the first internal voltage driver 510 of the peripheral logic circuit 120 and the third internal voltage driver 530 of the ML module 130 may receive the internal power command CMD_IntPWR corresponding to the second idle mode and may therefore open a switch connected to the metal contact MC.

FIG. 6A is a table of internal voltage driver states according to an embodiment of the inventive concept.

Referring to FIG. 6A, the memory controller 200 may provide an external power command CMD_ExtPWR to the non-volatile memory device 100. The external power command CMD_ExtPWR may correspond to the first to third idle modes Idle_1 to Idle_3.

In the first idle mode Idle_1, the first internal voltage driver 510 of the peripheral logic circuit 120 may be deactivated (i.e. in the off state or the inactive state). In the second idle mode Idle_2, the first internal voltage driver 510 of the peripheral logic circuit 120, and the third internal voltage driver 530 of the ML module 130 may be deactivated. In the third idle mode Idle_3, the first to third internal voltage drivers 510 to 530 of the first components may be deactivated.

The monitoring circuit 151 may indicate one of the first to third idle modes Idle_1 to Idle_3 by identifying whether the ML module 130 is operating and whether the ML parameter data is stored in the buffer memory 140 and by providing the monitoring signal to the memory controller 200 periodically or in response to a request of the memory controller 200. The monitoring signal may include at least one of the buffer flag signal and the MAC flag signal, and the monitoring circuit 151 may also receive the buffer flag signal and the MAC flag signal.

The monitoring circuit 151 may provide the monitoring signal to the memory controller 200 at predefined time intervals. The memory controller 200 may determine whether the ML module 130 is operating and whether the ML parameter data is stored in the buffer memory 140 based on the monitoring signal received by the memory controller 200. The memory controller 200 may provide the external power command CMD_ExtPWR corresponding to one of the first to third idle modes Idle_1 to Idle_3 to the internal power command generating circuit 152 based on a result of this determination.

In an embodiment, whenever the monitoring signal is updated, the monitoring circuit 151 may provide the updated monitoring signal to the memory controller 200. For example, when at least one of the MAC flag signal and the buffer flag signal is updated, the monitoring circuit 151 may generate and provide a corresponding updated monitoring signal to the memory controller 200 in response.

In an embodiment, before the external power command CMD_ExtPWR is generated, the memory controller 200 may request the operation state of each of the first components of the non-volatile memory device 100 by outputting a monitoring request. The peripheral power management IC 150 may provide the monitoring signal to the memory controller 200 in response to receiving the monitoring request. The memory controller 200 may generate a determination result by determining whether the ML module 130 is operating and whether the ML parameter data is stored in the buffer memory 140 based on the received monitoring request, and may provide the external power command CMD_ExtPWR corresponding to the determination result.

FIG. 6B illustrates the mapping table 153 according to an embodiment of the inventive concept.

Referring to FIG. 6B, each of the first to third internal voltage drivers 510 to 530 may adaptively adjust a level of an input voltage applied to each of the first components based on a control signal. The control signal may include the internal power command CMD_IntPWR and/or the external power command CMD_ExtPWR.

Referring to FIG. 6B in conjunction with FIG. 5, while the first to third internal voltage drivers 510 to 530 are each connected to the same external voltage Vext, a switch and a voltage driver (e.g., a voltage regulator) included in each of the first to third internal voltage drivers 510 to 530 may independently operate, and thus, the first to third internal voltage drivers 510 to 530 may correspond to different power planes.

For example, referring to case 1 and case 2 of the mapping table 153, while an input voltage (and power level) of the peripheral logic circuit 120 may decrease from, for example, 1.3 V to 1.1 V via the first internal voltage driver 510, an input voltage (and power level) of each of the buffer memory 140 and the peripheral power management IC 150 may be maintained at, for example, 1.1 V. For example, referring to case 1 and case 2 of the mapping table 153, the neural network inference operation and the training of the neural network may indicate an optimal input voltage, and the input voltage of the ML module 130 may increase from, for example, 0.8 V to 1.0 V based on the optimal input voltage, while the input voltage of each of the buffer memory 140 and the peripheral power management IC 150 may be maintained at, for example, 1.1 V.

In an embodiment, the first to third internal voltage drivers 510 to 530 may be independently driven, and an input voltage level relationship between the first to third internal voltage drivers 510 to 530 may be predetermined. In an embodiment, the page buffer 125 included in the peripheral logic circuit 120 senses an output from the memory cell array 110, and the input voltage of the peripheral logic circuit 120 may therefore be highest among the input voltages of the first components, thereby minimizing noise.

For example, in an embodiment, the peripheral power management IC 150 may open a switch connected to the external voltage and the peripheral logic circuit 120 in response to receiving the external power command CMD_ExtPWR corresponding to the idle mode, may determine whether the MAC flag signal is received, and may generate, when the MAC flag signal is received, the internal power command CMD_IntPWR, wherein the internal power command CMD_IntPWR corresponds to the first idle mode, and wherein in the first idle mode, a switch corresponding to each of the ML module 130, the buffer memory 140, and the external voltage Vext is closed. In an embodiment, the peripheral power management IC 150 may determine, when the MAC flag signal is not received, whether the buffer flag signal is received, and may generate, when the buffer flag signal is received, the internal power command CMD_IntPWR, wherein the internal power command CMD_IntPWR corresponds to the second idle mode, and wherein in the second idle mode, a switch corresponding to each of the ML module 130 and the external voltage Vext is opened and a switch corresponding to each of the buffer memory 140 and the external voltage Vext is closed. In an embodiment, the peripheral power management IC 150 may generate, when the MAC flag signal and the buffer flag signal are not received, the internal power command CMD_IntPWR, wherein the internal power command CMD_IntPWR corresponds to the third idle mode, and wherein in the third idle mode, a switch corresponding to each of the ML module 130, the buffer memory 140, and the external voltage Vext is opened.

Figure 7:
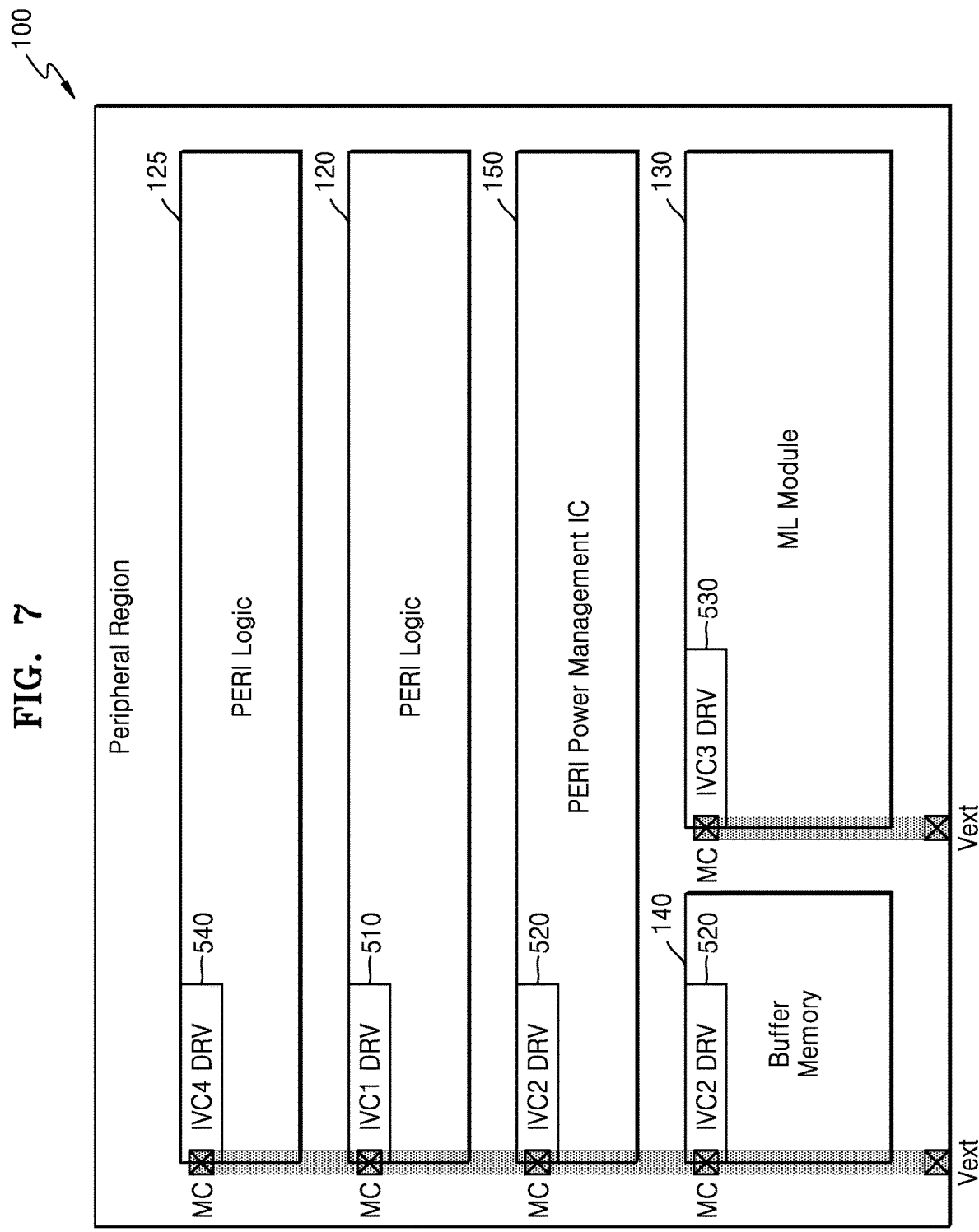
FIG. 7 is a wiring diagram of the non-volatile memory device of FIG. 1 according to an embodiment of the inventive concept.

FIG. 7 is a wiring diagram of the non-volatile memory device 100 according to an embodiment of the inventive concept. The repeated description of structure that is substantially the same to structure that has been previously described will be omitted.

Referring to FIG. 7, in an embodiment, the non-volatile memory device 100 may include the first to third internal voltage drivers 510 to 530, and the page buffer 125 may include a fourth internal voltage driver 540.

The first to fourth internal voltage drivers 510 to 540 may operate independently of each other. For example, the internal power command generating circuit 152 may independently perform on/off switching for each of the first to fourth internal voltage drivers 510 to 540.

Similar to an embodiment described with reference to FIG. 6B, in an embodiment, an input voltage level relationship between the first to fourth internal voltage drivers 510 to 540 may be predetermined in the mapping table 153. In an embodiment, the page buffer 125 that includes the fourth internal voltage driver 540 senses an output from the memory cell array 110, and therefore the input voltage of the page buffer 125 may be higher than the input voltages of the first components, thereby minimizing noise.

In an embodiment, the peripheral logic circuit 120 may include a charge pump, and thus, the input voltage of the first internal voltage driver 510 may be less than or equal to the input voltage of the fourth internal voltage driver 540, the input voltage of the each of the second internal voltage drivers 520 may be less than or equal to that of the first internal voltage driver 510 and less than or equal to the voltage level of the third internal voltage driver 530.

FIG. 8 is a table of internal voltage driver states according to an embodiment of the inventive concept.

Referring to FIG. 8, the memory controller 200 may provide the external power command CMD_ExtPWR to the non-volatile memory device 100. The external power command CMD_ExtPWR may correspond to first to fourth idle modes Idle_1 to Idle_4.

In the fourth idle mode Idle_4, the fourth internal voltage driver 540 of the page buffer 125 may be deactivated. In the first idle mode Idle_1, the fourth internal voltage driver 540 of the page buffer 125 and the first internal voltage driver 510 of the peripheral logic circuit 120 may be deactivated. In the second idle mode Idle_2, the fourth internal voltage driver 540 of the page buffer 125, the first internal voltage driver 510 of the peripheral logic circuit 120, and the third internal voltage driver 530 of the ML module 130 may be deactivated. In the third idle mode Idle_3, the first to fourth internal voltage drivers 510 to 540 may be deactivated.

Figure 9:
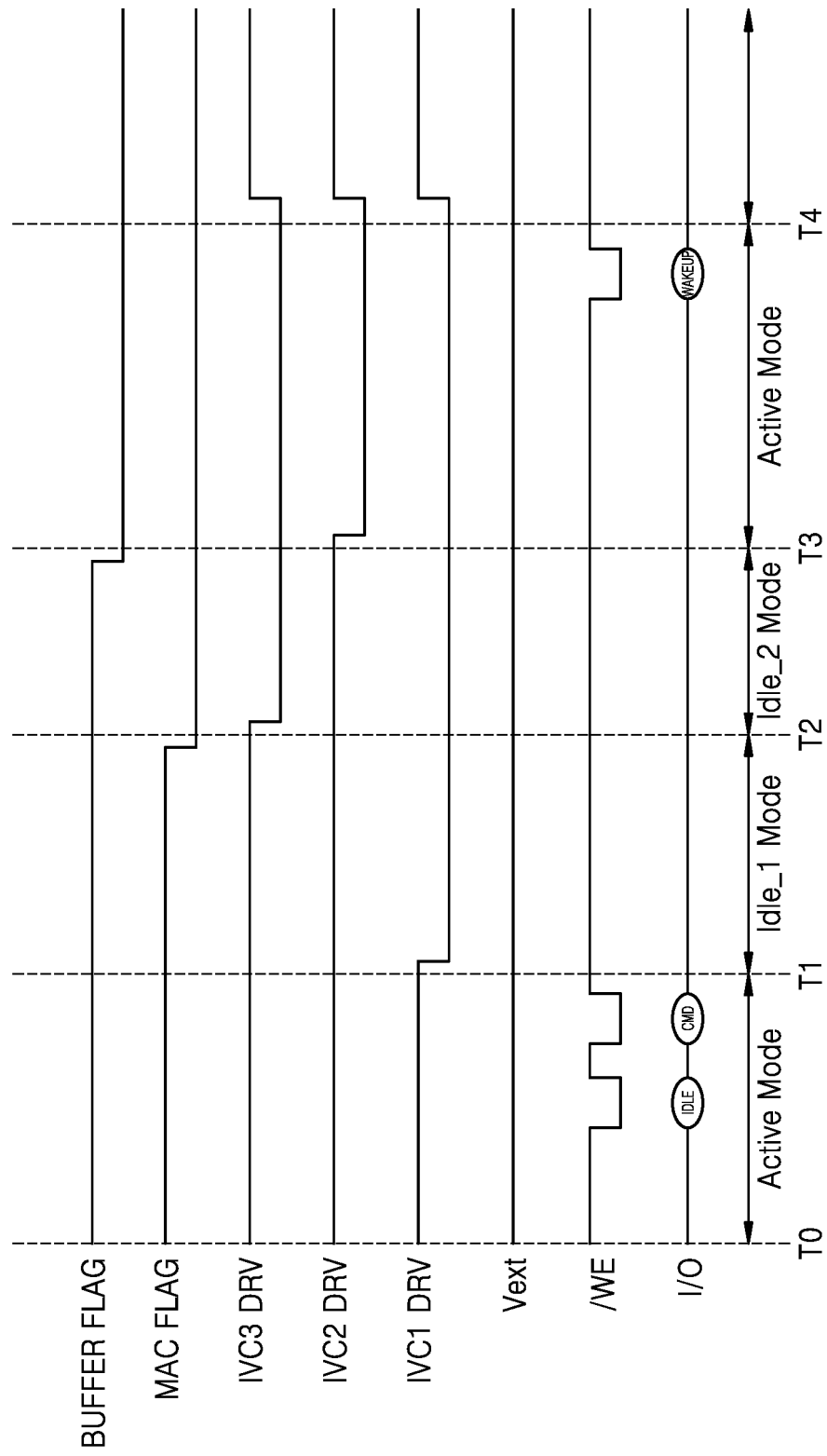
FIG. 9 is a timing diagram illustrating a mode change of a non-volatile memory device according to an embodiment of the inventive concept.

FIG. 9 is a timing diagram illustrating a mode change of a non-volatile memory device according to an embodiment of the inventive concept.

Referring to FIG. 9, in an active mode period between time T0 and time T1, the memory controller 200 may receive a command corresponding to an idle mode. The memory controller 200 may receive the command corresponding to the idle mode based on a write enable signal that is toggled. In response to the command corresponding to the idle mode, the memory controller 200 may provide an external power command CMD_ExtPWR corresponding to the idle mode to the peripheral power management IC 150 of the non-volatile memory device 100.

At time T1, the peripheral power management IC 150 may receive the external power command CMD_ExtPWR corresponding to the idle mode and may change the first internal voltage driver 510 to an off state in response. Because an MAC flag signal and a buffer flag signal are received at time T1, the peripheral power management IC 150 may change only the peripheral logic circuit 120 to the off state, and the third internal voltage driver 530 of the ML module 130 and the second internal voltage driver 520 of the buffer memory 140 may maintain an on state.

At time T2, the MAC flag signal may be changed. The peripheral power management IC 150 may identify that the ML module 130 is not operating at time T2, and the peripheral power management IC 150 may therefore change the third internal voltage driver 530 of the ML module 130 to the off state. A period from time T1 to time T2 may correspond to the first idle mode Idle_1.

At time T3, the buffer flag signal may be changed. The peripheral power management IC 150 may identify that the ML parameter data is not stored in the buffer memory 140 at time T3, and the peripheral power management IC 150 may therefore change the third internal voltage driver 530 of the buffer memory 140 to the off state. A period from time T2 to time T3 may correspond to the second idle mode Idle_2. All of the first components may be changed to the off state with respect to time T3, and thus, a period from time T3 to time T4 at which a wakeup command is received by the memory controller 200 may correspond to the third idle mode Idle_3. At time T4, the memory controller 200 may receive the wakeup command and may provide the wakeup command to each of the first components, and thus, the first to third internal voltage drivers 510 to 530 may be changed to the on state.

Figure 10:
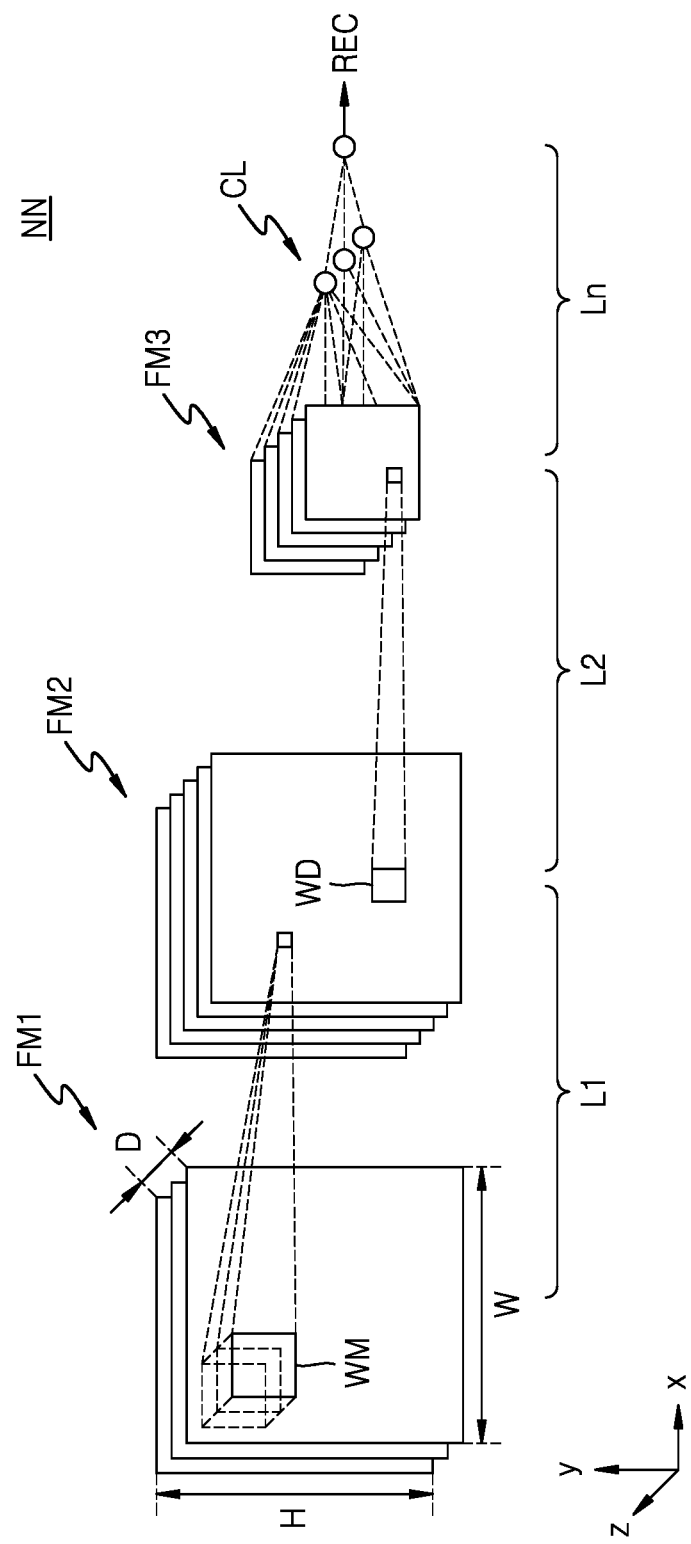
FIG. 10 illustrates a neural network and arithmetic processing operations using the neural network according to an embodiment of the inventive concept.

FIG. 10 illustrates a neural network NN and arithmetic processing operations correspond to the neural network NN according to an embodiment of the inventive concept.

Referring to FIG. 10, the neural network NN may include a plurality of layers L1 to Ln. Each layer of the plurality of layers L1 to Ln may include a linear layer or a nonlinear layer or alternatively, each layer of the plurality of layers L1 to Ln may include a combination of at least one linear layer and at least one nonlinear layer. A linear layer may include a convolution layer and a fully connected layer, and a nonlinear layer may include a sampling layer, a pooling layer, and an activation layer.

For example, the first layer L1 may include a convolution layer (i.e., a layer that performs a convolution operation of the plurality of arithmetic operations) and the second layer L2 may include a sampling layer (i.e., a layer that performs a sampling operation of the plurality of arithmetic operations). The neural network NN may further include an activation layer and a layer that performs a different arithmetic operation of the plurality of arithmetic operations than those previously described.

Each layer of the plurality of layers may receive image data or an input feature map generated by a previous layer of the plurality of layers, and may generate an output feature map by performing an arithmetic operation of the plurality of arithmetic operations on the input feature map.

The first layer L1 may generate a second feature map FM2 by performing a convolution operation of the plurality of arithmetic operations on a first feature map FM1 and a weight map WM. The weight map WM may filter the first feature map FM1 and may be referred to as a filter or a kernel. For example, a depth (i.e., the number of channels) of the weight map WM may be the same as a depth of the first feature map FM1, and the convolution may be performed on corresponding channels of the weight map WM and the first feature map FM1. The weight map WM may be shifted based on a crossing scheme by using the first feature map FM1 as a sliding window. A shifted amount may be referred to as a "stride length" or a "stride". While the shift is being performed, each weight of the weight map WM may be multiplied by, and added to, all feature values in a region overlapping the first feature map FM1. As the convolution is performed on the first feature map FM1 and the weight map WM, a channel of the second feature map FM2 may be generated. In FIG. 2, one weight map WM is illustrated, but the convolution may be performed on a plurality of weight maps and the first feature map FM1 to generate a plurality of channels of the second feature map FM2. In other words, the number of channels of the second feature map FM2 may correspond to the number of weight maps.

The second layer L2 may generate a third feature map FM3 by changing a spatial size of the second feature map FM2. For example, the second layer L2 may include a sampling layer. The second layer L2 may perform up-sampling or down-sampling, and the second layer L2 may select some pieces of data from among pieces of data included in the second feature map FM2. For example, a two-dimensional (2D) window WD may be shifted in the second feature map FM2 by size units (for example, a 4*4 matrix) of a window WD and may select a value of a certain position (for example, row one, column one) in a region overlapping the window WD. The second layer L2 may output selected data of the third feature map FM3. For example, the second layer L2 may include a pooling layer, and the second layer L2 may select an average pooling value or a maximum pooling value of feature values of the region overlapping the window WD in the second feature map FM2. The second layer L2 may output selected data of the third feature map FM3.

Therefore, a third feature map FM3 in which a spatial size of the third feature map FM3 has been changed from the second feature map FM2 may be generated from the second feature map FM2. The number of channels of the third feature map FM3 may be the same as the number of channels of the second feature map FM2. In an embodiment, an operational speed of the sampling layer may be faster than that of the pooling layer, and the sampling layer may increase the quality of an output image (for example, in terms of a peak signal to noise ratio (PSNR)). For example, an arithmetic operation of the plurality of arithmetic operations performed by the pooling layer calculates a maximum value or an average value, and thus, may be performed for a longer time than an arithmetic operation of the plurality of arithmetic operations performed by the sampling layer.

In an embodiment, the second layer L2 may include a sampling layer, a pooling layer, and a convolution layer that is similar to the first layer L1, the second layer L2 may generate the third feature map FM3 by performing a convolution operation of the plurality of arithmetic operations on the second feature map FM2 and a weight map WM, and the weight map WM on which the convolution operation has been performed by the second layer L2 including a sampling layer, a pooling layer, and a convolution layer may differ from the weight map WM on which a convolution operation has been performed by the second layer L2 including a sampling layer and a pooling layer.

An $N^{th}$ feature map may be generated by an $N^{th}$ layer of the plurality of layers L1 to Ln. The $N^{th}$ feature map may be input to a reconstruction layer disposed in a back end of the neural network NN. The reconstruction layer may generate and output an output image based on the $N^{th}$ feature map. The reconstruction layer may receive a plurality of feature maps including, for example, the first feature map FM1 and the second feature map FM2, in addition to the $N^{h}$ feature map, and may generate and output the output image based on the plurality of feature maps. The $N^{th}$ layer Ln of the plurality of layers L1 to Ln may generate an output signal REC by combining features of the third feature map FM3. For example, the output signal REC may include at least one of an optimal program voltage value, an optimal erase voltage value, and an optimal defensive code that correspond to program target cells.

Figure 11:
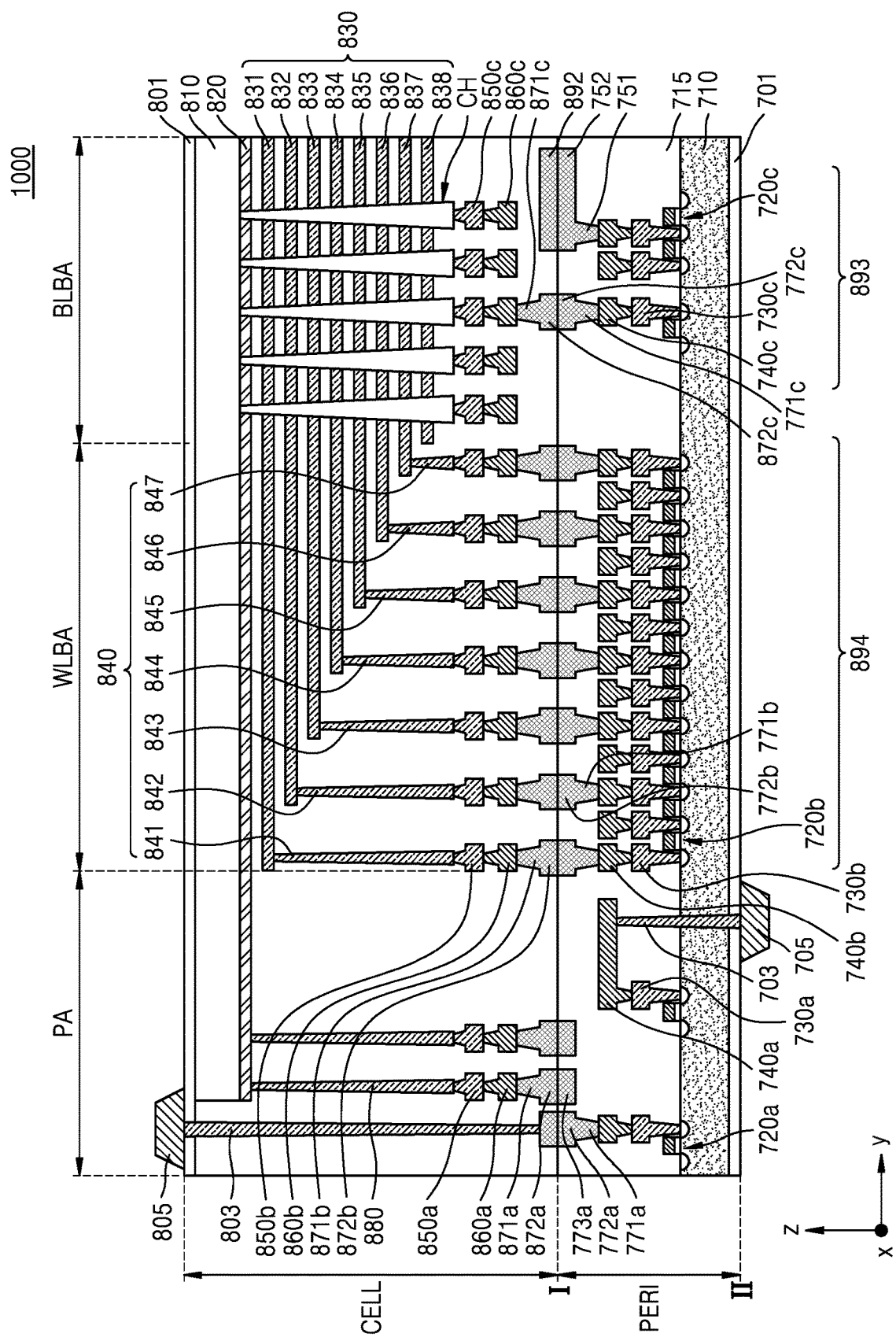
FIG. 11 is a cross-sectional view of a memory device according to an embodiment of the inventive concept.

FIG. 11 is a cross-sectional view of a memory device 1000 according to an embodiment. In an embodiment, the memory device 1000 may be implemented as the nonvolatile memory device 100.

Referring to FIG. 11, the memory device 1000 may be arranged in a chip-to chip (C2C) structure. The C2C structure may include an upper chip that includes a cell region CELL manufactured in a first wafer, a lower chip that includes a peripheral region PERI manufactured in a second wafer that differs from the upper chip, and the upper chip may connect to the lower chip by a bonding process. For example, the bonding process may include electrically connecting a bonding metal formed in an uppermost metal layer of the upper chip to a bonding metal formed in an uppermost metal layer of the lower chip. For example, the bonding metal may include copper (Cu), and the bonding process may therefore include a Cu—Cu bonding process; however, the bonding metal may additionally or alternatively include aluminum or tungsten.

The peripheral region PERI and the cell region CELL of the memory device 1000 may each include an external pad bonding region PA, a word line bonding region WLBA, and a bit line bonding region BLBA.

The peripheral region PERI may include a first substrate 710, an interlayer insulation layer 715, a plurality of circuit elements 720a to 720c formed in the first substrate 710, a plurality of first metal layers 730a to 730c respectively connected to the plurality of circuit elements 720a to 720c, and a plurality of second metal layers 740a to 740c formed on the plurality of first metal layers 730a to 730c. In an embodiment, the plurality of first metal layers 730a to 730c may include tungsten, which is relatively high in resistance, and the plurality of second metal layers 740a to 740c may include copper, which is relatively low in resistance.

FIG. 11 illustrates the plurality of first metal layers 730a to 730c and the plurality of second metal layers 740a to 740c; however, one or more metal layers may be further formed on the second metal layers 740a to 740c. At least some of the one or more metal layers formed on the second metal layers 740a to 740c may include aluminum having a resistance which is lower than that of copper included in the second metal layers 740a to 740c.

The interlayer insulation layer 715 may be disposed on the first substrate 710 and may cover the plurality of circuit elements 720a to 720c, the plurality of first metal layers 730a to 730c, and the plurality of second metal layers 740a to 740c, and may include an insulating material such as silicon oxide or silicon nitride.

A plurality of lower bonding metals 771b and 772b may be formed on the second metal layer 740b of the word line bonding region WLBA. In the word line bonding region WLBA, the lower bonding metals 771b and 772b of the peripheral region PERI may be electrically connected to upper bonding metals 871b and 872b of the cell region CELL by a bonding process, and the lower bonding metals 771b and 772b and the upper bonding metals 871b and 872b may include aluminum, copper, or tungsten.

The cell region CELL may provide at least one memory block. The cell region CELL may include a second substrate 810 and a common source line 820. A plurality of word lines 831 to 838 (collectively 830) may be stacked on the second substrate 810 in a third direction (a Z-axis direction) perpendicular to a top surface of the second substrate 810. A plurality of string selection lines and a ground selection line may be disposed on and under the word lines 830, and the word lines of the plurality of word lines 830 may be disposed between the string selection lines and the ground selection line.

In the bit line bonding region BLBA, a channel structure CH may extend in the third direction perpendicular to a top surface of the second substrate 810 and may pass through the word lines 830, the string selection lines, and the ground selection line. The channel structure CH may include a data storage layer, a channel layer, and a buried insulation layer, and the channel layer may be electrically connected to a first metal layer 850c and a second metal layer 860c. For example, the first metal layer 850c may be a bit line contact, and the second metal layer 860c may be a bit line. In an embodiment, the bit line 860c may extend in a first direction (a Y-axis direction) parallel to the top surface of the second substrate 810.

In an embodiment, a region where the channel structure CH and the bit line 860c are disposed may be defined as the bit line bonding region BLBA. The bit line 860c may be electrically connected to the circuit elements 720c to constitute a page buffer 893 in the peripheral region PERI in the bit line bonding region BLBA. For example, the bit line 860c may connect to a plurality of upper bonding metals 871c and 872c in the peripheral region PERI, and the upper bonding metals 871c and 872c may connect to a plurality of lower bonding metals 771c and 772c connected to the circuit elements 720c of the page buffer 893.

In the word line bonding region BLBA, the word lines 830 may extend in a second direction (an X-axis direction) parallel to the top surface of the second substrate 810 and perpendicular to the second direction and to the third direction and may connect to a plurality of cell contact plugs 841 to 847 (840). The word lines 830 and the cell contact plugs 840 may connect to one another via a plurality of pads, as at least some of the word lines 830 may extend by different lengths in the second direction. A first metal layer 850a and a second metal layer 860b may sequentially connect to upper portions of the cell contact plugs 840 connected to the word lines 830. The cell contact plugs 840 may connect to the peripheral region PERI via the lower bonding metals 771b and 772b of the peripheral region PERI and the upper bonding metals 871b and 872b of the cell region CELL in the word line bonding region WLBA.

The cell contact plugs 840 may electrically connect to the circuit elements 720b to constitute a row decoder 894 in the peripheral region PERI. In an embodiment, an operating voltage of each of the circuit elements 720b in the row decoder 894 may differ from an operating voltage of each of the circuit elements 720c in the page buffer 893. For example, the operating voltage of each of the circuit elements 720c in the page buffer 893 may be higher than the operating voltage of each of the circuit elements 720b in the row decoder 894.

A common source line contact plug 880 may be disposed in an external pad bonding region PA. The common source line contact plug 880 may include a conductive material such as metal, a metal compound, or polysilicon and may electrically connect to the common source line 820. The first metal layer 850a and the second metal layer 860a may be sequentially stacked on the common source line contact plug 880. For example, a region where the common source line contact plug 880, the first metal layer 850a, and the second metal layer 860a are disposed may be defined as the external pad bonding region PA.

A plurality of input/output (I/O) pads (for example, first and second I/O pads) 705 and 805 may be disposed in the external pad bonding region PA. A lower insulation layer 701 covering a bottom surface of the first substrate 710 may be formed under the first substrate 710, and the first I/O pad 705 may be formed on the lower insulation layer 701. The first I/O pad 705 may connect to at least one of the plurality of circuit elements 720a to 720c disposed in the peripheral region PERI via a first I/O contact plug 703 and may be separated from the first substrate 710 by the lower insulation layer 701. In an embodiment, a side insulation layer may be disposed between the first I/O contact plug 703 and the first substrate 710 and may electrically disconnect the first I/O contact plug 703 from the first substrate 710.

An upper insulation layer 801 covering the top surface of the second substrate 810 may be formed on the second substrate 810, and the second I/O pad 805 may be disposed on the upper insulation layer 801. The second I/O pad 805 may connect to at least one of the plurality of circuit elements 720a to 720c, disposed in the peripheral region PERI via a second I/O contact plug 803.

In an embodiment, the second substrate 810 and the common source line 820 may be omitted from a region in which the second I/O contact plug 803 is disposed. In an embodiment, the second I/O pad 805 may not overlap the word lines 830 in the third direction (the Z-axis direction). The second I/O contact plug 803 may be separated from the second substrate 810 in a direction parallel to the top surface of the second substrate 810, and may pass through the interlayer insulation layer 815 of the cell region CELL and may connect to the second I/O pad 805.

In an embodiment, the first I/O pad 705 and the second I/O pad 805 may be optionally formed. For example, the memory device 1000 may include the first I/O pad 705 disposed on the first substrate 710 and may omit the second I/O pad 805, or may include the second I/O pad 805 disposed on the second substrate 810 and may omit the first I/O pad 705. In an embodiment, the memory device 1000 may include both of the first I/O pad 705 and the second I/O pad 805.

In an embodiment, in each of the external pad bonding region PA and the bit line bonding region BLBA included in each of the cell region CELL and the peripheral region PERI, a metal pattern of an uppermost metal layer may be provided as a dummy pattern. In an embodiment, the uppermost metal layer may be omitted.

In the memory device 1000, in the external pad bonding region PA, a lower metal pattern 773a having the same shape as that of an upper metal pattern 872a of the cell region CELL may be formed in the uppermost metal layer of the peripheral region PERI based on the upper metal pattern 872a formed in the uppermost metal layer of the cell region CELL. The lower metal pattern 773a formed in the uppermost metal layer of the peripheral region PERI may not connect to a separate contact in the peripheral region PERI. Similarly, in the external pad bonding region PA, an upper metal pattern having the same shape as that of a lower metal pattern of the peripheral region PERI may be formed in an upper metal layer of the cell region CELL based on the lower metal pattern formed in the uppermost metal layer of the peripheral region PERI.

The lower bonding metals 771b and 772b may be formed on the second metal layer 740b of the word line bonding region WLBA. In the word line bonding region WLBA, the lower bonding metals 771b and 772b of the peripheral region PERI may be electrically connected to the upper bonding metals 871b and 872b of the cell region CELL by a bonding process. In the bit line bonding region BLBA, an upper metal pattern 892 having the same shape as that of a lower metal pattern 752 of the peripheral region PERI may be formed in an uppermost metal layer of the cell region CELL based on the lower metal pattern 752 formed in the uppermost metal layer of the peripheral region PERI. A contact may not be formed on the upper metal pattern 892 formed in the uppermost metal layer of the cell region CELL.

While the inventive concept has been particularly shown and described with reference to embodiments thereof, it will be understood that various changes in form and details may be made therein without departing from the spirit and scope of the present disclosure.

What is claimed is:

1. A non-volatile memory device comprising:
 a memory cell array;
 a buffer memory configured to receive machine learning (ML) parameter data from the memory cell array and to temporarily store the ML parameter data;
 a peripheral logic circuit that includes a row decoder, a page buffer, and a scheduler unit, wherein the scheduler unit schedules a write operation and a read operation;
 an ML module that includes an inference module configured to output an optimal value corresponding to an input received from the peripheral logic circuit by performing an inference operation, a multiply-accumulate (MAC) circuit configured to perform a plurality of arithmetic operations for the inference module, and an ML logic circuit configured to generate a monitoring signal indicating a state of each of the MAC circuit and the buffer memory, wherein the ML module configures a neural network based on the ML parameter data; and
 a peripheral power management integrated circuit (IC) configured to receive an external power command corresponding to an idle mode from a memory controller and to generate an internal power command that is different from the external power command based on the received external power command and the monitoring signal.

2. The non-volatile memory device of claim 1, wherein the peripheral power management IC comprises:
 a monitoring circuit configured to monitor the ML module by receiving an MAC flag signal and a buffer flag signal from the ML logic circuit;
 a mapping table configured to store combinations of input voltage levels of the peripheral logic circuit, the ML module, and the buffer memory; and
 an internal power command generating circuit configured to generate the internal power command based on the MAC flag signal and the buffer flag signal, wherein the internal power command indicates an internal voltage level and an on state or an off state of each of the peripheral logic circuit, the ML module, and the buffer memory.

3. The non-volatile memory device of claim 2, wherein the MAC flag signal indicates whether the MAC circuit is operating, and
 the buffer flag signal indicates whether the ML parameter data is loaded into the buffer memory.

4. The non-volatile memory device of claim 3, wherein the peripheral logic circuit further comprises a first internal voltage driver configured to convert an external voltage into a first internal voltage,
 the peripheral power management IC and the buffer memory each further comprise a second internal voltage driver configured to convert the external voltage into a second internal voltage,
 the ML module further comprises a third internal voltage driver configured to convert the external voltage into a third internal voltage, and
 the peripheral power management IC and the buffer memory are configured to share a power plane via each of the second internal voltage drivers.

5. The non-volatile memory device of claim 4, wherein each of the first to third internal voltage drivers is independently turned on or off based on the internal power command received from the peripheral power management IC, or is configured to adaptively adjust an internal voltage level.

6. The non-volatile memory device of claim 4, wherein the internal power command generating circuit is configured to:
change the on state of the first internal voltage driver to the off state in response to receiving the external power command;
determine whether the MAC flag signal is received; and
generate, when the MAC flag signal is received, the internal power command, wherein the internal power command corresponds to a first idle mode, and wherein in the first idle mode, the on state of the second internal voltage driver and the third internal voltage driver is maintained.

7. The non-volatile memory device of claim 6, wherein the internal power command generating circuit is configured to:
determine, when the MAC flag signal is not received, whether the buffer flag signal is received;
generate, when the buffer flag signal is received, the internal power command, wherein the internal power command corresponds to a second idle mode, wherein in the second idle mode, the on state of the second internal voltage driver is maintained and the on state of the third internal voltage driver is changed to the off state; and
generate, when the buffer flag signal is not received, the internal power command, wherein the internal power command corresponds to a third idle mode, wherein in the third idle mode, the on state of each of the first to third internal voltage drivers are changed to the off state.

8. The non-volatile memory device of claim 1, wherein the memory cell array is included in a first wafer,
the peripheral logic circuit, the buffer memory, the ML module, and the peripheral power management IC are included in a second wafer that is different from the first wafer, and
the first wafer and the second wafer are bonded to each other in a chip-to-chip (C2C) structure.

9. A memory system comprising:
a non-volatile memory device including a machine learning (ML) module and a peripheral power management integrated circuit (IC); and
a memory controller configured to command the non-volatile memory device to enter an idle mode by providing an external power command to the non-volatile memory device,
wherein the machine learning (ML) module configures a neural network and trains the neural network via machine learning, and the peripheral power management IC is configured to generate an internal power command that is different from the external power command based on the external power command and monitoring information corresponding to the ML module.

10. The memory system of claim 9, wherein the non-volatile memory device further comprises a memory cell array configured to store ML parameter data corresponding to the neural network, a buffer memory configured to load the ML parameter data from the memory cell array, and a peripheral logic circuit that includes a row decoder, a page buffer, and a scheduler that schedules a write operation and a read operation, and
the ML module further comprises an inference module configured to perform a neural network inference operation, a training module configured to update the ML parameter data by training the neural network, a multiply-accumulate (MAC) circuit configured to perform a plurality of arithmetic operations for each of the inference module and the training module, and an ML logic circuit configured to generate an MAC flag signal indicating whether the MAC circuit is operating and a buffer flag signal indicating whether the ML parameter data is loaded into the buffer memory.

11. The memory system of claim 10, wherein the peripheral power management IC is configured to:
open a switch connected to an external voltage and the peripheral logic circuit in response to receiving the external power command corresponding to the idle mode;
determine whether the MAC flag signal is received;
generate, when the MAC flag signal is received, the internal power command, wherein the internal power command corresponds to a first idle mode, wherein in the first idle mode, a switch corresponding to each of the ML module, the buffer memory, and the external voltage is closed;
determine, when the MAC flag signal is not received, whether the buffer flag signal is received;
generate, when the buffer flag signal is received, the internal power command, wherein the internal power command corresponds to a second idle mode, wherein in the second idle mode, a switch corresponding to each of the ML module and the external voltage is opened and a switch corresponding to each of the buffer memory and the external voltage is closed; and
generate, when the MAC flag signal and the buffer flag signal are not received, the internal power command, wherein the internal power command corresponds to a third idle mode, wherein in the third idle mode, a switch corresponding to each of the ML module, the buffer memory, and the external voltage is opened.

12. The memory system of claim 10, wherein the peripheral power management IC is configured to, before the external power command is received, provide the MAC flag signal and the buffer flag signal to the memory controller, and
the memory controller is configured to generate the external power command indicating an on state or an off state of each of the peripheral logic circuit, the ML module, and the buffer memory based on the MAC flag signal and the buffer flag signal.

13. The memory system of claim 10, wherein the memory cell array is included in a first wafer,
the peripheral logic circuit, the buffer memory, the ML module, and the peripheral power management IC are included in a second wafer that is different from the first wafer, and
the first wafer and the second wafer are bonded to each other in a chip-to-chip (C2C) structure.

14. The memory system of claim 10, wherein the peripheral logic circuit further comprises a first internal voltage driver configured to convert an external voltage into a first internal voltage,
the peripheral power management IC and the buffer memory further comprise a second internal voltage driver configured to convert the external voltage into a second internal voltage,
the ML module further comprises a third internal voltage driver configured to convert the external voltage into a third internal voltage, and
the peripheral power management IC and the buffer memory are configured to share a power plane via each of the second internal voltage drivers.

15. The memory system of claim 14, wherein the first to third internal voltage drivers are independently turned on or off, and a voltage level of each of the first to third internal voltages is adaptively set.

16. An operating method of a peripheral power management integrated circuit (IC) controlling an internal voltage of a non-volatile memory device, the operating method comprising:
receiving an external power command corresponding to an idle mode from a memory controller;
turning off a peripheral logic circuit of the non-volatile memory device in response to receiving the external power command;
receiving a monitoring signal from a machine learning (ML) module of the non-volatile memory device; and
generating an internal power command indicating an on state or an off state of the ML module and a buffer memory based on the monitoring signal, wherein
the monitoring signal comprises at least one of a multiply-accumulate (MAC) flag signal corresponding to a state of an MAC circuit performing an arithmetic operation for the ML module and a buffer flag signal corresponding to a state of the buffer memory loading ML parameter data corresponding to a neural network of the ML module.

17. The operating method of claim 16, wherein the generating of the internal power command comprises:
maintaining the on state of each of the ML module and the buffer memory when the monitoring signal includes the MAC flag signal; and
generating an internal power command corresponding to a first idle mode; wherein
in the first idle mode, the peripheral logical circuit is in the off state and the ML module and the buffer memory are in the on state.

18. The operating method of claim 16, wherein the generating of the internal power command comprises:
changing the ML module to the off state and maintaining the buffer memory in the on state when the monitoring signal includes only the buffer flag signal; and
generating an internal power command indicating a second idle mode, wherein
in the second idle mode, the peripheral logical circuit and the ML module are in the off state and the buffer memory is in the on state.

19. The operating method of claim 16, wherein the generating of the internal power command further comprises:
changing the ML module and the buffer memory to the off state when the monitoring signal is not received; and
generating an internal power command indicating a third idle mode, wherein
in the third idle mode, the peripheral logical circuit, the ML module, and the buffer memory are in the off state.

20. The operating method of claim 16, wherein the internal power command independently indicates the on state or the off state and voltage levels for each of the peripheral logical circuit, the ML module, and the buffer memory, and
the buffer memory and the peripheral power management IC correspond to a power plane.

* * * * *